United States Patent
Cheng et al.

(10) Patent No.: US 9,502,439 B2
(45) Date of Patent: Nov. 22, 2016

(54) ARRAY SUBSTRATE AND A DISPLAY DEVICE

(71) Applicant: Boe Technology Group Co., Ltd., Beijing (CN)

(72) Inventors: Hongfei Cheng, Beijing (CN); Yong Qiao, Beijing (CN); Jianbo Xian, Beijing (CN); Wenbo Li, Beijing (CN); Pan Li, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/500,634

(22) Filed: Sep. 29, 2014

(65) Prior Publication Data

US 2015/0380434 A1 Dec. 31, 2015

(30) Foreign Application Priority Data

Jun. 25, 2014 (CN) .......................... 2014 2 0344323

(51) Int. Cl.
| | |
|---|---|
| *H01L 27/12* | (2006.01) |
| *G02F 1/1362* | (2006.01) |
| *G02F 1/1343* | (2006.01) |
| *G02F 1/1368* | (2006.01) |

(52) U.S. Cl.
CPC ......... *H01L 27/124* (2013.01); *G02F 1/13624* (2013.01); *G02F 1/134309* (2013.01); *G02F 1/136286* (2013.01); *G02F 2001/134345* (2013.01)

(58) Field of Classification Search
None
See application file for complete search history.

(56) References Cited

U.S. PATENT DOCUMENTS

| | | | |
|---|---|---|---|
| 2007/0177067 A1* | 8/2007 | Kim | G02F 1/13624 349/43 |
| 2015/0116622 A1* | 4/2015 | Kim | G02F 1/136286 349/43 |
| 2015/0241740 A1* | 8/2015 | Yoo | G02F 1/134309 349/42 |

* cited by examiner

*Primary Examiner* — Whitney T Moore
(74) *Attorney, Agent, or Firm* — Calfee, Halter & Griswold LLP

(57) ABSTRACT

An array substrate comprises a plurality of subpixels, each of the subpixels comprising: at least one thin film transistor, an organic resin layer, and uncontacted first pixel electrode and second pixel electrode arranged along the data line direction; the first pixel electrode extends to the above of a first gate line, the second pixel electrode extends to the above of a second gate line, the first gate line and the second gate line are adjacent to each other; the first pixel electrodes of two adjacent subpixels located at two sides of the first gate line are connected above the first gate line, the second pixel electrodes of two adjacent subpixels located at two sides of the second gate line are connected above the second gate line.

16 Claims, 6 Drawing Sheets

ARRAY SUBSTRATE AND A DISPLAY DEVICE

RELATED APPLICATIONS

The present application claims the benefit of Chinese Patent Application No. 201420344323.8, filed Jun. 25, 2014, the entire disclosure of which is incorporated herein by reference.

TECHNICAL FIELD

The present invention relates to the field of display technology, especially to an array substrate and a display device.

BACKGROUND OF THE INVENTION

The thin film transistor-liquid crystal display (TFT-LCD) has characteristics such as small volume, low energy consumption, radiation free etc., and occupies the dominant position in the current display market.

The TFT-LCD comprises an array substrate, a color film substrate and a liquid crystal layer located between the two; wherein, as shown in FIG. 1, the array substrate 01 comprises a plurality of subpixels 10, each of the subpixels 10 is defined by intersection of two adjacent gate lines 20 and two adjacent data lines 30, each subpixel 10 comprises a thin film transistor 101 and a pixel electrode 102 connected with the drain of the thin film transistor.

At present, in order to prevent the gate line 20 signal from interfering the pixel electrode 102, it is required to set a certain spacing L between the pixel electrode 102 and the gate line 20, and this spacing L should not be too small, which will certainly result in that part of the light that passes through the spacing L cannot be controlled by the liquid crystal layer driven by the pixel electrode 102 and the common electrode, thereby being finally filtered by a black matrix of the color film substrate, which may influence the aperture opening ratio.

SUMMARY OF THE INVENTION

The embodiment of the present invention provides an array substrate and a display device, which may increase the aperture opening ratio.

In order to achieve the above purpose, the embodiment of the present invention adopts the following technical solutions:

According to a first aspect of the present invention, an array substrate is provided, comprising a plurality of subpixels, each of the subpixels being defined by intersection of two adjacent gate lines and two adjacent data lines; each of the subpixels comprises: at least one thin film transistor, an organic resin layer located above the thin film transistor, and a first pixel electrode and a second pixel electrode located above the organic resin layer and arranged along the data line direction; wherein the first pixel electrode and the second pixel electrode are out of contact;

the first pixel electrode extends to the above of a first gate line that is close to the first pixel electrode, the second pixel electrode extends to the above of a second gate line that is close to the second pixel electrode; wherein the first gate line and the second gate line are adjacent to each other;

along the data line direction and between any two adjacent data lines, the first pixel electrodes of two adjacent subpixels located at two sides of the first gate line are both close to the first gate line and are connected above the first gate line, the second pixel electrodes of two adjacent subpixels located at two sides of the first gate line are both away from the first gate line;

along the data line direction and between any two adjacent data lines, the second pixel electrodes of two adjacent subpixels located at two sides of the second gate line are both close to the second gate line and are connected above the second gate line, the first pixel electrodes of two adjacent subpixels located at two sides of the second gate line are both away from the second gate line;

the first pixel electrodes of two adjacent subpixels at two sides of the first gate line are electrically connected with the drain of at least one thin film transistor, the second pixel electrodes of two adjacent subpixels at two sides of the second gate line are electrically connected with the drain of at least one thin film transistor.

Preferably, in each of the subpixels, the first pixel electrode and/or the second pixel electrode electrically connected with the drain of the thin film transistor expose the area of the thin film transistor.

Preferably, each of the subpixels comprises a first thin film transistor and a second thin film transistor; the drain of the first thin film transistor is electrically connected with the first pixel electrode, the drain of the second thin film transistor is electrically connected with the second pixel electrode;

along the data line direction, the gates of two first thin film transistors in two adjacent subpixels located at two sides of the first gate line are both connected with the first gate line, and are both symmetrical relative to the first gate line; the gates of two second thin film transistors in two adjacent subpixels located at two sides of the second gate line are both connected with the second gate line, and are both symmetrical relative to the second gate line.

Preferably, the first pixel electrode and the second pixel electrode both extend to the above of the data line along the gate line direction.

Preferably, the areas of the first pixel electrode and the second pixel electrode are equal.

Preferably, the thickness of the organic resin layer is 1~3 μm.

Preferably, each of the subpixels further comprises a common electrode located above the first pixel electrode and the second pixel electrode.

According to a second aspect of the present invention, a display device comprising the above array substrate is provided.

By means of the array substrate or the display device provided by the present invention, since an organic resin layer is arranged between the thin film transistor and the first pixel electrode and the second pixel electrode, and the thickness of the insulating layer in organic material is generally at the micron level, the interference of the gate line signal to the first pixel electrode and the second pixel electrode can be avoided, moreover, parasitic capacitance generated between the first pixel electrode and the second pixel electrode and respective electrodes of the thin film transistor can be reduced. On such a basis, in the embodiment of the present invention, since there is no spacing between the first pixel electrode and the second pixel electrode in each subpixel and the closer first gate line and second gate line respectively, and since there is no mutual interference between the first pixel electrode and the second pixel electrode in each subpixel, the spacing between the first pixel electrode and the second pixel electrode can be made very small. Therefore, relative to the defect in the prior art that a certain spacing is set between the pixel electrode in each subpixel and the gate line which may result in decrease of the aperture opening ratio, the array substrate or the display device provided by the present invention can increase the aperture opening ratio.

BRIEF DESCRIPTION OF DRAWINGS

In order to explain the technical solutions in the embodiments of the present invention or in the prior art more clearly, the drawings to be used in the depiction of the embodiments or the prior art will be introduced briefly in the following. The drawings described below are only some schematic embodiments of the present invention, for the ordinary skilled person in the art, other variations can also be obtained based on the spirit of the present invention.

DETAILED DESCRIPTION OF THE DRAWINGS

In the following, the technical solutions in the embodiments of the present invention will be described clearly and completely in combination with the drawings of the present invention. Apparently, the described embodiments are only part rather than all of the embodiments of the present invention. Based on the embodiments in the present invention, other embodiments obtained by the ordinary skilled person in the art without any creative work all belong to the protection scope of the present invention.

Figure 1:
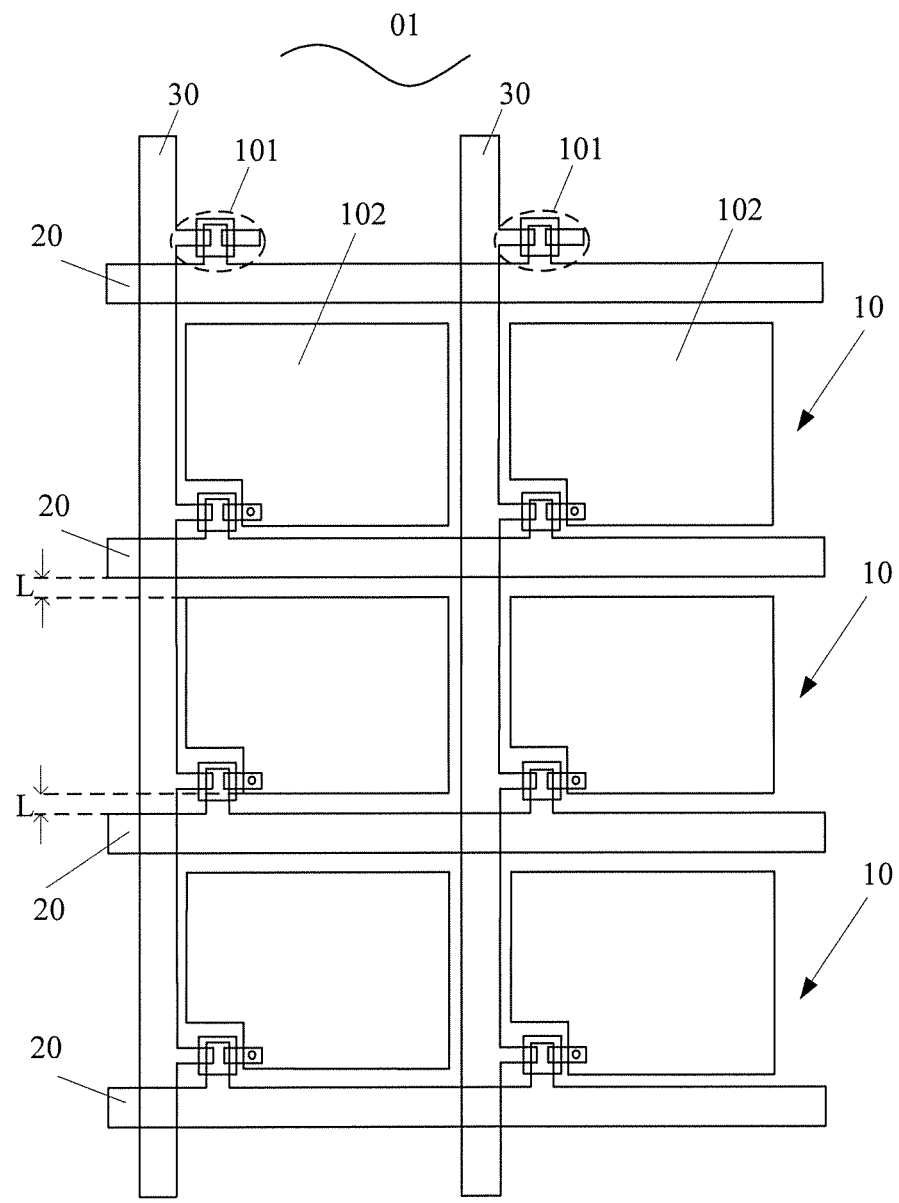
FIG. 1 is a structural schematic view of an array substrate provided by the prior art.
Figure 2:
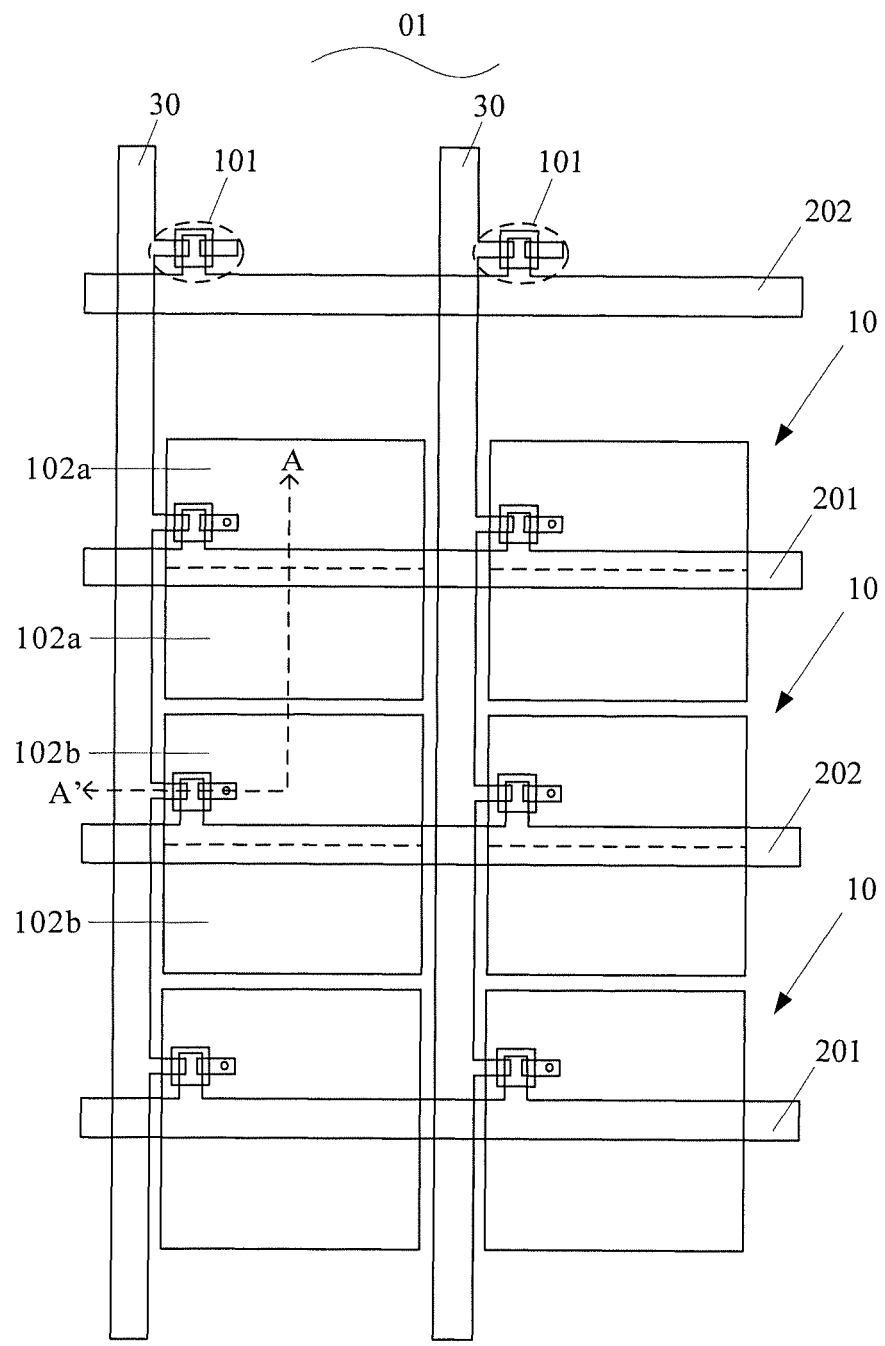
FIG. 2 is a structural schematic view I of an array substrate provided by an embodiment of the present invention.
Figure 4:
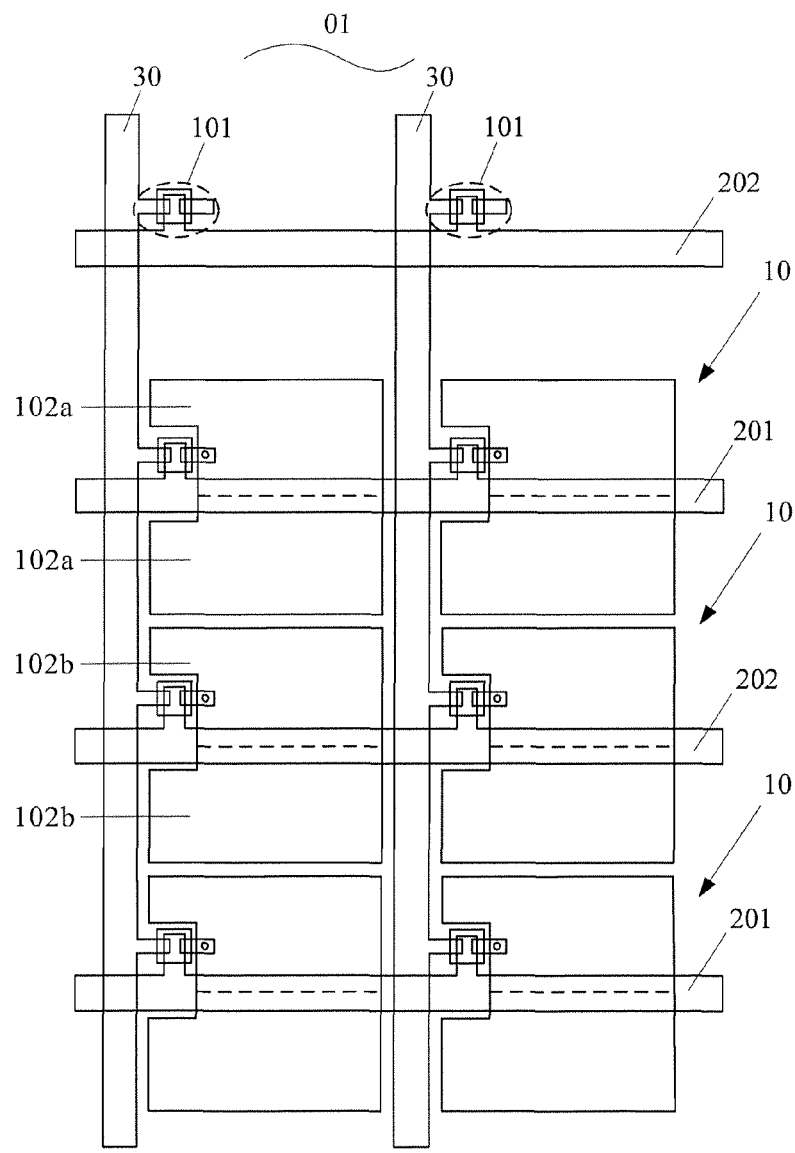
FIG. 4 is a structural schematic view II of an array substrate provided by an embodiment of the present invention.
Figure 5:
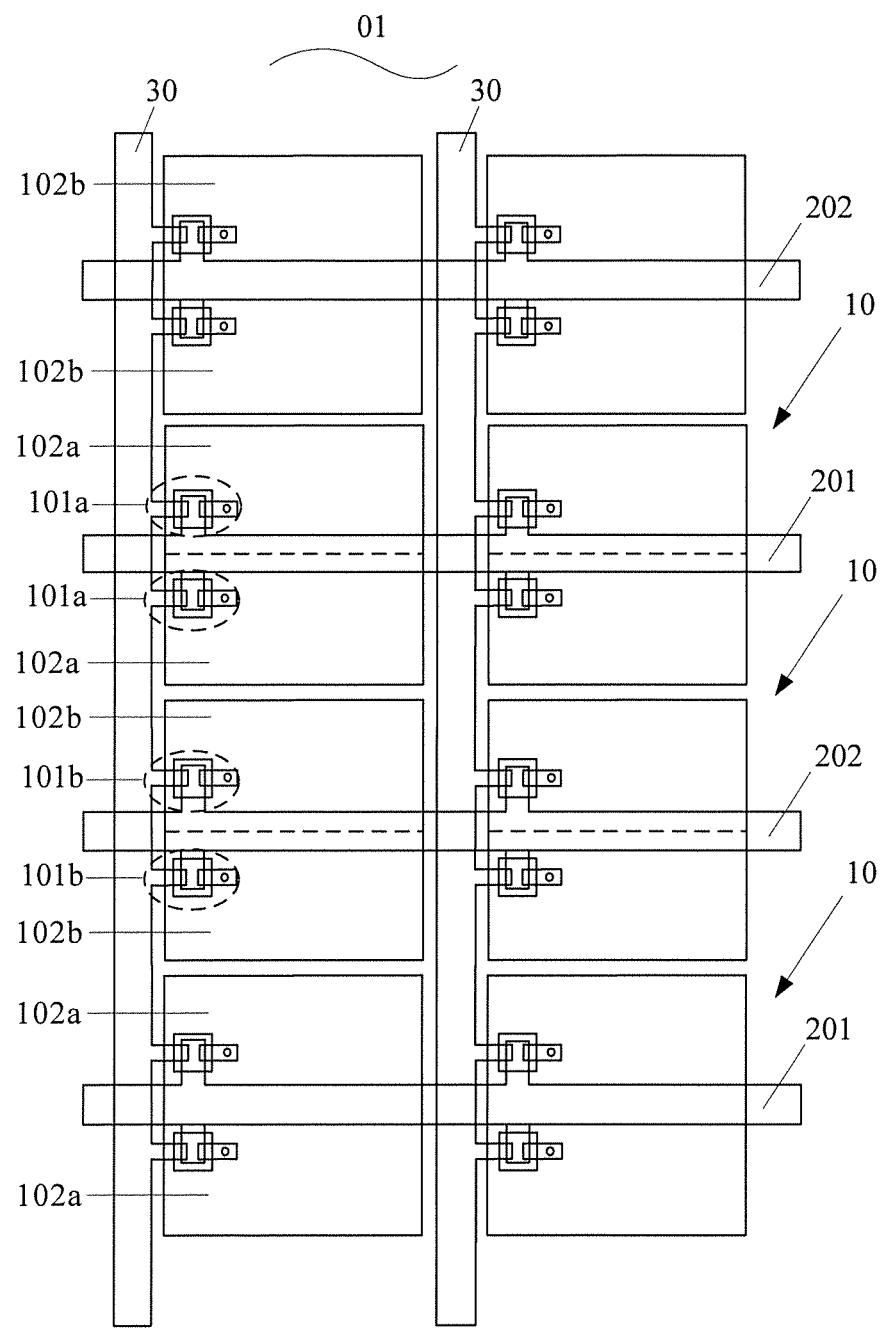
FIG. 5 is a structural schematic view III of an array substrate provided by an embodiment of the present invention.

According to an embodiment of the present invention, an array substrate 01 is provided, as shown in FIG. 2, FIG. 4, and FIG. 5, the array substrate 01 comprises a plurality of subpixels 10, each of the subpixels 10 being defined by intersection of two adjacent gate lines and two adjacent data lines 30.

Figure 3:
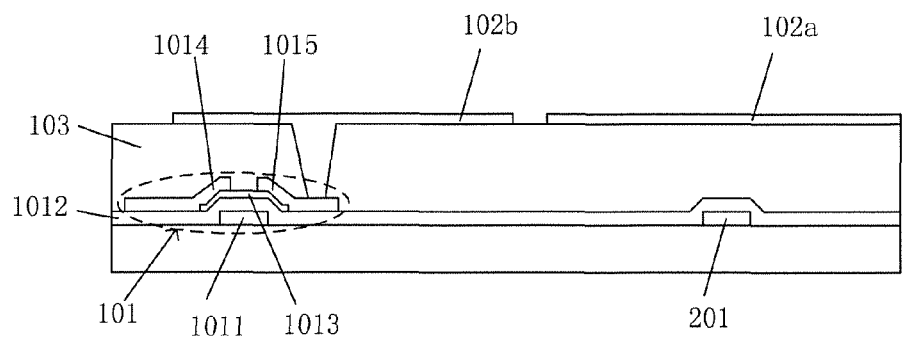
FIG. 3 is a sectional schematic view along the line A of FIG. 2 in the direction of line A' of FIG. 2.

As shown in FIG. 3, each subpixel 10 comprises: at least one thin film transistor 101, an organic resin layer 103 located above the thin film transistor, and a first pixel electrode 102a and a second pixel electrode 102b located above the organic resin layer 103 and arranged along a data line 30 direction; wherein the first pixel electrode 102a and the second pixel electrode 102b are out of contact.

The first pixel electrode 102a extends to the above of the first gate line 201 which is close to the first pixel electrode 102a, the second pixel electrode 102b extends to the above of the second gate line 202 which is close to the second pixel electrode 102b. Wherein the first gate line 201 and the second gate line 202 are adjacent to each other.

Along the data line 30 direction and between any two adjacent data lines 30, the first pixel electrodes 102a of two adjacent subpixels 10 located at two sides of the first gate line 201 are both close to the first gate line 201 and are connected above the first gate line 201, the second pixel electrodes 102b of two adjacent subpixels 10 located at two sides of the first gate line 201 are both away from the first gate line 201.

Along the data line 30 direction and between any two adjacent data lines 30, the second pixel electrodes 102b of two adjacent subpixels 10 located at two sides of the second gate line 202 are both close to the second gate line 202 and are connected above the second gate line 202, the first pixel electrodes 102a of two adjacent subpixels 10 located at two sides of the second gate line 202 are both away from the second gate line 202.

The first pixel electrodes 102a of two adjacent subpixels 10 at two sides of the first gate line 201 are electrically connected with the drain 1015 of at least one thin film transistor 101, the second pixel electrodes 102b of two adjacent subpixels 10 located at two sides of the second gate line 202 are electrically connected with the drain 1015 of at least one thin film transistor 101.

The thin film transistor 101 may comprise a gate 1011, a gate insulating layer 1012, an active layer 1013, a source 1014 and a drain 1015.

The materials of the gate 1011, the source 1014 and the drain 1015, the gate line, the date line 30 may be Cu, Al, Mo, Ti, Cr, W etc., and may also be alloy of these materials. The material of the gate insulating layer 1012 may be silicon nitride or silicon oxide. The material of the active layer 1013 may be amorphous silicon, metal oxide semiconductor (MOS) etc. The material of the organic resin layer 103 may be ordinary resin or photosensitive resin etc. The material of the pixel electrode may be indium tin oxide (ITO), indium zinc oxide (IZO) or other transparent metal oxide conductive materials.

It shall be noted that the skilled person should know that regardless of whether an array substrate is in a small size or a large size, it comprises a plurality of gate lines, i.e., comprising a first gate line, a second gate line, a third gate line . . . a Nth gate line along the data line direction, whereas in the embodiments of the present invention, any two adjacent gate lines are called a first gate line 201 and a second gate line 202. For example: if the first gate line is the first gate line 201, the second gate line will be the second gate line 202, the third gate line will be the first gate line 201, and so forth. That is to say, as for any gate line, if the gate line is called the first gate line 201, the two gate lines adjacent to it are both called the second gate line 202, similarly, if the gate line is called the second gate line 202, the two gate lines adjacent to it are both the first gate line 201.

Based on this, after the first gate line 201 and the second gate line 202 are determined, as for a subpixel 10 defined by any two adjacent data lines 30 and any two adjacent first gate lines 201 and second gate lines 202, the first pixel electrode 102a therein is close to the first gate line 201 and extends onto the first gate line 201 (i.e., the first pixel electrode 102a has an overlapping area with the first gate line 201), the second pixel electrode 102b therein is close to the second gate line 202 and extends onto the second gate line 202 (i.e., the second pixel electrode 102a has an overlapping area with the second gate line 201).

On the basis of this, as for two adjacent subpixels 10 defined by any two adjacent data lines 30 and any first gate line 201 and two second gate lines 202 located at two sides of the first gate line 201, the first pixel electrodes 102a in the two subpixels 10 should both be close to and extend onto the first gate line 201, the second pixel electrodes 102b in the two subpixels 10 should be close to and extend onto the second gate line 202 that is close to it respectively (i.e., away from the first gate line 201).

Similarly, as for two adjacent subpixels 10 defined by any two adjacent data lines 30 and any second gate line 202 and two first gate lines 201 located at two sides of the second gate line 202, the second pixel electrodes 102b in the two subpixels 10 should be close to and extend onto the second gate line 202, the first pixel electrodes 102a in the two subpixels 10 should be close to and extend onto the first gate line 201 that is close to it respectively (i.e., away from the second gate line 202).

For example: as for two adjacent subpixels 10 defined by two vertical adjacent data lines 30 and a second gate line, a third gate line, a fourth gate line ordered from the top down, when the second gate line, the third gate line, the fourth gate line are the first gate line 201, the second gate line 202, the first gate line 201 respectively, as for a subpixel 10 located between the second gate line and the third gate line, the first pixel electrode 102a therein is close to the second gate line and extends onto the second gate line, the second pixel electrode 102b is close to the third gate line and extends onto the third gate line; as for a subpixel 10 located between the third gate line and the fourth gate line, the second pixel electrode 102b therein is close to the third gate line and extends onto the third gate line, the first pixel electrode 102a is close to the fourth gate line and extends onto the fourth gate line.

It shall be noted that since each subpixel comprises a first pixel electrode 102a and a second pixel electrode 102b, and along the data line 30 direction, the first pixel electrodes 102a of two adjacent subpixels 10 located at two sides of the first gate line 201 are both close to the first gate line 201 and are connected above the first gate line 201, the skilled person in the art therefore should easily learn that the first pixel electrodes 102a located in two adjacent two subpixels 10 are integrally formed.

Similarly, since each subpixel comprises a first pixel electrode 102a and a second pixel electrode 102b, and along the data line 30 direction, the second pixel electrodes 102b of two adjacent subpixels 10 located at two sides of the second gate line 202 are both close to the second gate line 202 and are connected above the second gate line 202, the skilled person in the art therefore should easily learn that the second pixel electrodes 102b located in two adjacent two subpixels 10 are integrally formed.

That is to say, as for a column of subpixels 10 located between any two adjacent data lines 30, the first pixel electrodes 102a of two adjacent subpixels 10 located at two sides of any first gate line 201 are integrally formed, moreover, the second pixel electrodes 102b of two adjacent subpixels 10 located at two sides of any second gate line 202 are integrally formed.

It shall also be noted that since the first pixel electrodes 102a or the second pixel electrodes 102b located in adjacent subpixels 10 are connected together, when a thin film transistor 101 is arranged in each subpixel 10, it only needs to enable the drains 1015 of the thin film transistors 101 in two adjacent subpixels 10 to be electrically connected with the first pixel electrodes 102a and the second pixel electrodes 102b respectively.

In the embodiments of the present invention, the type of the thin film transistor is not defined, it may be either a top gate type or a bottom gate type.

According to an embodiment of the present invention, an array substrate 01 is provided, comprising a plurality of subpixels 10, each of the subpixels 10 being defined by intersection of two adjacent gate lines and two adjacent data lines 30; each of the subpixels 10 comprises: at least one thin film transistor 101, an organic resin layer 103 located above the thin film transistor, and a first pixel electrode 102a and a second pixel electrode 102b located above the organic resin layer 103 and arranged along a data line 30 direction; wherein the first pixel electrode 102a and the second pixel electrode 102b are out of contact; the first pixel electrode 102a extends to the above of the first gate line 201 which is close to the first pixel electrode 102a, the second pixel electrode 102b extends to the above of the second gate line 202 which is close to the second pixel electrode 102b. The first gate line 201 and the second gate line 202 are adjacent to each other; along the data line 30 direction and between any two adjacent data lines 30, the first pixel electrodes 102a of two adjacent subpixels 10 located at two sides of the first gate line 201 are both close to the first gate line 201 and are connected above the first gate line 201, the second pixel electrodes 102b of two adjacent subpixels 10 located at two sides of the first gate line 201 are both away from the first gate line 201; along the data line 30 direction and between any two adjacent data lines 30, the second pixel electrodes 102b of two adjacent subpixels 10 located at two sides of the second gate line 202 are both close to the second gate line 202 and are connected above the second gate line 202, the first pixel electrodes 102a of two adjacent subpixels 10 located at two sides of the second gate line 202 are both away from the second gate line 202; the first pixel electrodes 102a of two adjacent subpixels 10 at two sides of the first gate line 201 are electrically connected with the drain 1015 of at least one thin film transistor 101, the second pixel electrodes 102b of two adjacent subpixels 10 located at two sides of the second gate line 202 are electrically connected with the drain 1015 of at least one thin film transistor 101.

In respective embodiments of the present invention, since an organic resin layer 103 is arranged between the thin film transistor 101 and the first pixel electrode 102a and the second pixel electrode 102b, and the thickness of the insulating layer in organic material is generally at the micron level, the interference of the gate line signal to the first pixel electrode 102a and the second pixel electrode 102b can be avoided, moreover, parasitic capacitance generated between the first pixel electrode 102a and the second pixel electrode 102b and respective electrodes of the thin film transistor 101 can be reduced. On such a basis, in the embodiment of the present invention, since there is no spacing between the first pixel electrode 102a and the closer first gate line 201 and between the the second pixel electrode 102b and second gate line 202 in each subpixel 10, and since there is no mutual interference between the first pixel electrode 102a and the second pixel electrode 102b in each subpixel 10, the spacing between the first pixel electrode 102a and the second pixel electrode 102b can be made very small. Therefore, relative to the defect in the prior art that a certain spacing is set between the pixel electrode in each subpixel 10 and the gate line which may result in decrease of the aperture opening ratio, the aperture opening ratio is increased in the array substrate of the present invention because of the reduced spacing between the first pixel electrode 102a and the second pixel electrode 102b in each subpixel 10.

As shown in FIG. 4, in order to avoid generation of parasitic capacitance between the first pixel electrode 102a and the second pixel electrode 102b and respective electrodes of the thin film transistor 101, thereby resulting in impact on the array substrate, according to a preferred embodiment of the present invention, preferably, in each subpixel 10, the first pixel electrode 102a and/or the second pixel electrode 102b electrically connected with the drain 1015 of the thin film transistor 101 expose the area of the thin film transistor 101.

Since the drain 1015 of the thin film transistor 101 needs to be electrically connected with the first pixel electrode 102a and/or the second pixel electrode 102b, and the drain 1015 belongs to a part of the thin film transistor 101, hence, the area of the thin film transistor 101 exposed by the first pixel electrode 102a and/or the second pixel electrode 102b is only relatively exposed, i.e., the part of the drain 1015 for connecting the first pixel electrode 102a and/or the second pixel electrode 102b can be made not to be exposed.

Preferably, as shown in FIG. 5, each subpixel 10 comprises a first thin film transistor 101a and a second thin film transistor 101b.

Alternatively, the drain 1015 of the first thin film transistor 101a is electrically connected with the first pixel electrode 102a, the drain 1015 of the second thin film transistor 101b is electrically connected with the second pixel electrode 102b.

Preferably, along the data line 30 direction, the gates 1011 of two first thin film transistors 101a in two adjacent subpixels 10 located at two side of the first gate 201 are both connected with the first gate line 201, and are both symmetrical relative to the first gate line 201; the gates 1011 of two second thin film transistors 101b in two adjacent subpixels 10 located at two sides of the second gate line 202 are both connected with the second gate line 202, and are both symmetrical relative to the second gate line 202.

Preferably, relative to arranging one thin film transistor 101 in each subpixel 10, such that a voltage drop is generated in two first pixel electrodes 102a or two second pixel electrodes 102b when the thin film transistor 101 drives two first pixel electrodes 102a or two second pixel electrodes 102b of two adjacent subpixels 10, according to an embodiment of the present invention, two thin film transistors are arranged in each subpixel 10 for driving two first pixel electrodes 102a or two second pixel electrodes 102b of two adjacent subpixels 10 respectively, the generation of a voltage drop can be avoided, thereby improving the performance of the array substrate 01.

Figure 6:
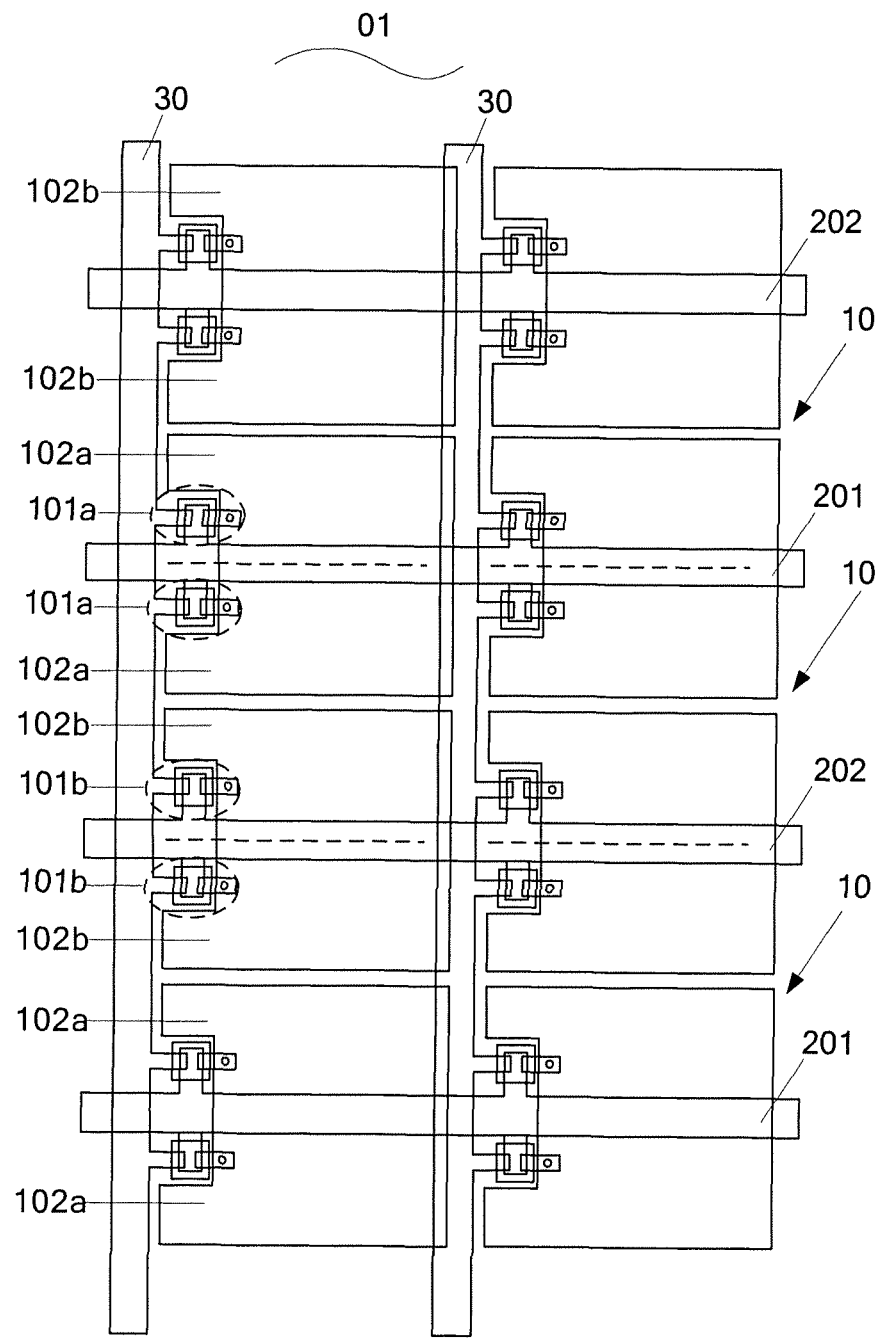
FIG. 6 is a structural schematic view IV of an array substrate provided by an embodiment of the present invention.

In order to further increase the aperture opening ratio, as shown in FIG. 6, preferably, the first pixel electrode 102a and the second pixel electrode 102b both extend to the above of the data line 30 along the gate line direction.

Preferably, the areas of the first pixel electrode 102a and the second pixel electrode 102b are equal. In this way, it can be ensured that the areas of two connected first pixel electrodes 102 and two connected second pixel electrodes 102b of two adjacent subpixels 10 are equal, thereby ensuring the light emitting areas of various colors when the array substrate 01 is applied in a liquid crystal display device.

Preferably, in consideration of the current market requirement on thinness of the array substrate, the thickness of the organic resin layer 103 is preferably set to be 1~3 μM. The organic resin layer 103 is preferably an organic resin material with a low dielectric constant and being insulating, e.g. Phenol Thermosetting Resin (PTS), low dielectric and non-photosensitive organic resin etc.

On the basis of this, the array substrate 01 may further comprise an adhesion layer arranged under the organic resin layer 103, the adhesion layer is used for enhancing the bonding strength between the organic resin layer and the electrode layer of the closer thin film transistor 101. The adhesion layer may be a silicon nitride layer, or a silicon oxide layer, or a silicon oxynitride layer etc.

Preferably, the array substrate 01 provided according to an embodiment of the present invention is applicable in production of advanced super dimensional switching (ADS) type liquid crystal display devices. The core technical characteristics of the advanced super dimensional switching technology is described as: forming a multi-dimensional electric field by an electric field generated from edges of slit-electrodes in a same plane and an electric field generated between a slit-electrode layer and a plate-like electrode layer, so that liquid crystal molecules in all orientations between the slit-electrodes and over the electrodes within a liquid crystal cell to rotate, thereby improving work efficiency of the liquid crystal and increasing light transmission efficiency. ADS technology can improve image quality of a TFT-LCD product, makes it have advantages of high resolution, high transmittance, low power consumption, wide viewing angle, high aperture opening ratio, low chromatic aberration, and being free of Push Mura, etc.

Figure 7:
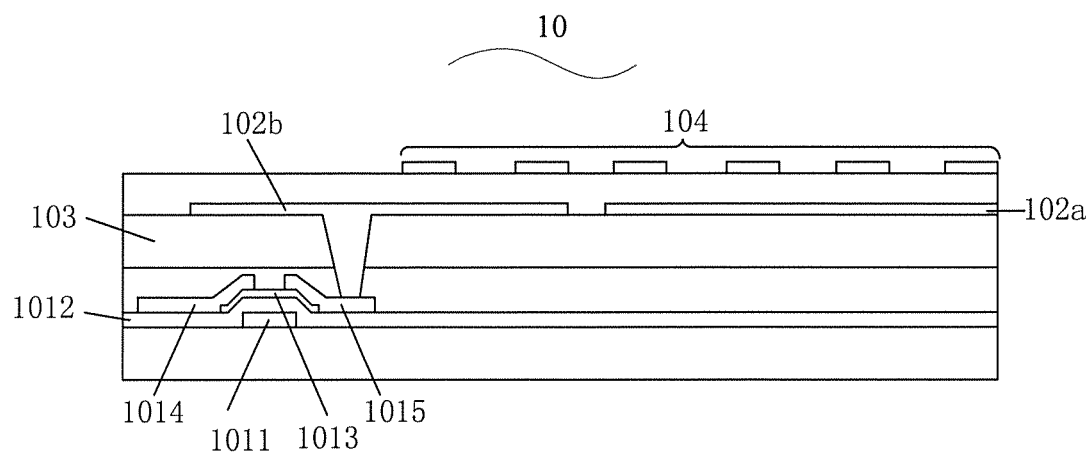
FIG. 7 is a structural schematic view of a subpixel of an array substrate provided by an embodiment of the present invention.

Preferably, as shown in FIG. 7, each subpixel 10 further comprises a common electrode 104 located above the first pixel electrode 102a and a second pixel electrode 102b.

An embodiment of the present invention further provides a display device comprising the above array substrate 01. The display device according to the present invention specifically can be any product or component with the display function, such as a liquid crystal display, a liquid crystal television, a digital photo frame, a mobile phone, a tablet computer etc.

It shall be noted that the skilled person in the art should understand that all the drawings in respective embodiments of the present invention are brief schematic views of the array substrate, only for describing the current solution clearly and representing the structures related to the inventive point, other structures unrelated to the inventive point are existing structures and are not represented or only partly represented in the drawings.

The above are only detailed description of the embodiments of the present invention, however, the protection scope of the present invention is not limited to this. Any variation or replacement within the technical scope disclosed by the present invention that can be easily conceived by skilled person familiar with the present technical field shall be covered within the protection scope of the present invention. Therefore, the protection scope of the present invention shall be based on the protection scope of the claims.

What is claimed is:

1. An array substrate, comprising; a plurality of subpixels, each of the subpixels being defined by intersection of two adjacent gate lines and two adjacent data lines, wherein each of the subpixels comprising comprises: at least one thin film transistor, a organic resin layer located above the thin film transistor, and a first pixel electrode and a second pixel electrode located above the organic resin layer and arranged along the data line direction; wherein the first pixel electrode and the second pixel electrode are out of contact; wherein the first pixel electrode extends to the above of a first gate line that is close to the first pixel electrode, the second pixel electrode extends to the above of a second gate line that is close to the second pixel electrode; wherein the first gate line and the second gate line are adjacent to each other; wherein along the data line direction and between any two adjacent data lines, the first pixel electrodes of two adjacent subpixels located at two sides of the first gate line are both close to the first gate line and are connected above the first gate line, the second pixel electrodes of two adjacent subpixels located at two sides of the first gate line are both away from the first gate line; wherein along the data line direction and between any two adjacent data lines, the second pixel electrodes of two adjacent subpixels located at two sides of the second gate line are both close to the second gate line and are connected above the second gate line, the first pixel electrodes of two adjacent subpixels located at two sides of the second gate line are both away from the second gate line; and wherein the first pixel electrodes of two adjacent subpixels at two sides of the first gate line are electrically connected with the drain of at least one thin film transistor, the second pixel electrodes of two adjacent subpixels at two sides of the second gate line are electrically connected with the drain of at least one thin film transistor.

2. The array substrate according to claim 1, wherein in each of the subpixels, the first pixel electrode and/or the second pixel electrode electrically connected with the drain of the thin film transistor expose the area of the thin film transistor.

3. The array substrate according to claim 2, wherein:
each of the subpixels comprises a first thin film transistor and a second thin film transistor;
the drain of the first thin film transistor is electrically connected with the first pixel electrode, the drain of the second thin film transistor is electrically connected with the second pixel electrode;
along the data line direction, the gates of two first thin film transistors in two adjacent subpixels located at two sides of the first gate line are both connected with the first gate line, and are both symmetrical relative to the first gate line;
the gates of two second thin film transistors in two adjacent subpixels located at two sides of the second gate line are both connected with the second gate line, and are both symmetrical relative to the second gate line.

4. The array substrate according to claim 1, wherein:
each of the subpixels comprises a first thin film transistor and a second thin film transistor;
the drain of the first thin film transistor is electrically connected with the first pixel electrode, the drain of the second
thin film transistor is electrically connected with the second pixel electrode;
along the data line direction, the gates of two first thin film transistors in two adjacent subpixels located at two sides of the first gate line are both connected with the first gate line, and are both symmetrical relative to the first gate line;
the gates of two second thin film transistors in two adjacent subpixels located at two sides of the second gate line are both connected with the second gate line, and are both symmetrical relative to the second gate line.

5. The array substrate according to claim 1, wherein the first pixel electrode and the second pixel electrode both extend to the above of the data line along the gate line direction.

6. The array substrate according to claim 1, wherein the areas of the first pixel electrode and the second pixel electrode are equal.

7. The array substrate according to claim 1, wherein the thickness of the organic resin layer is 1~3 μm.

8. The array substrate according to claim 1, wherein each of the subpixels further comprise a common electrode located above the first pixel electrode and the second pixel electrode.

9. A display device, comprising an array substrate according to claim 1.

10. The display device according to claim 9, wherein in each of the subpixels, the first pixel electrode and/or the second pixel electrode electrically connected with the drain of the thin film transistor expose the area of the thin film transistor.

11. The display device according to claim 10, wherein:
each of the subpixels comprises a first thin film transistor and a second thin film transistor;
the drain of the first thin film transistor is electrically connected with the first pixel electrode, the drain of the second thin film transistor is electrically connected with the second pixel electrode;
along the data line direction, the gates of two first thin film transistors in two adjacent subpixels located at two sides of the first gate line are both connected with the first gate line, and are both symmetrical relative to the first gate line;
the gates of two second thin film transistors in two adjacent subpixels located at two sides of the second gate line are both connected with the second gate line, and are both symmetrical relative to the second gate line.

12. The display device according to claim 9, wherein:
each of the subpixels comprises a first thin film transistor and a second thin film transistor;
the drain of the first thin film transistor is electrically connected with the first pixel electrode, the drain of the second thin film transistor is electrically connected with the second pixel electrode;
along the data line direction, the gates of two first thin film transistors in two adjacent subpixels located at two sides of the first gate line are both connected with the first gate line, and are both symmetrical relative to the first gate line; the gates of two second thin film transistors in two adjacent subpixels located at two sides of the second gate line are both connected with the second gate line, and are both symmetrical relative to the second gate line.

13. The display device according to claim 9, wherein the first pixel electrode and the second pixel electrode both extend to the above of the data line along the gate line direction.

14. The display device according to claim 9, wherein the areas of the first pixel electrode and the second pixel electrode are equal.

15. The array substrate according to claim 9, wherein the thickness of the organic resin layer is 1~3 μm.

16. The display device according to claim 9, wherein each of the subpixels further comprise a common electrode located above the first pixel electrode and the second pixel electrode.

* * * * *